(12) United States Patent
Loubet et al.

(10) Patent No.: US 9,530,777 B2
(45) Date of Patent: Dec. 27, 2016

(54) FINFETS OF DIFFERENT COMPOSITIONS FORMED ON A SAME SUBSTRATE

(71) Applicants: STMicroelectronics, Inc., Coppell, TX (US); International Business Machines Corporation, Armonk, NY (US)

(72) Inventors: Nicolas Loubet, Guilderland, NY (US); Hong He, Schenectady, NY (US); James Kuss, Hudson, NY (US)

(73) Assignees: STMICROELECTRONICS, INC., Coppell, TX (US); INTERNATIONAL BUSINESS MACHINES CORPORATION, Armonk, NY (US)

( * ) Notice: Subject to any disclaimer, the term of this patent is extended or adjusted under 35 U.S.C. 154(b) by 86 days.

(21) Appl. No.: 14/196,596

(22) Filed: Mar. 4, 2014

(65) Prior Publication Data

US 2015/0255457 A1     Sep. 10, 2015

(51) Int. Cl.
*H01L 29/66*       (2006.01)
*H01L 27/088*      (2006.01)
*H01L 29/78*       (2006.01)
*H01L 21/8234*     (2006.01)
*H01L 21/8238*     (2006.01)
(Continued)

(52) U.S. Cl.
CPC ... *H01L 27/0886* (2013.01); *H01L 21/823418* (2013.01); *H01L 21/823431* (2013.01); *H01L 21/823807* (2013.01); *H01L 21/823821* (2013.01); *H01L 27/0924* (2013.01); *H01L 29/66795* (2013.01); *H01L 29/785* (2013.01); *H01L 29/7848* (2013.01); *H01L 29/165* (2013.01)

(58) Field of Classification Search
CPC ......... H01L 29/7848; H01L 29/66795; H01L 21/823418; H01L 27/0886; H01L 27/0924
See application file for complete search history.

(56) References Cited

U.S. PATENT DOCUMENTS 7,078,299 B2 * 7/2006 Maszara ............... A61F 5/3776
                                                 257/E21.562
7,198,995 B2 * 4/2007 Chidambarrao H01L 21/823807
                                                 257/E21.633
(Continued)

OTHER PUBLICATIONS

T. Tezuka et al., "Dislocation-free formation of relaxed SiGe-on-insulator layers", Applied Physics Letters, vol. 80, p. 3560-3562, (2002).*

*Primary Examiner* — Allen Parker
*Assistant Examiner* — Stephen Bradley
(74) *Attorney, Agent, or Firm* — Seed IP Law Group LLP

(57) ABSTRACT

Methods and structures for forming finFETs of different semiconductor composition and of different conductivity type on a same wafer are described. Some finFET structures may include strained channel regions. FinFETs of a first semiconductor composition may be grown in trenches formed in a second semiconductor composition. Material of the second semiconductor composition may be removed from around some of the fins at first regions of the wafer, and may remain around fins at second regions of the wafer. A chemical component from the second semiconductor composition may be driven into the fins by diffusion at the second regions to form finFETs of a different chemical composition from those of the first regions. The converted fins at the second regions may include strain.

31 Claims, 9 Drawing Sheets

(51) Int. Cl.
  *H01L 27/092* (2006.01)
  *H01L 29/165* (2006.01)

(56) References Cited

U.S. PATENT DOCUMENTS

| | | | | |
|---|---|---|---|---|
| 7,851,313 | B1* | 12/2010 | Luo | H01L 21/30608 257/19 |
| 8,017,463 | B2* | 9/2011 | Chang | H01L 29/66795 257/E21.409 |
| 8,716,156 | B1* | 5/2014 | Pawlak | H01L 21/82382 438/770 |
| 8,921,940 | B2* | 12/2014 | Kim | H01L 21/76 257/342 |
| 9,034,723 | B1* | 5/2015 | Shieh | H01L 21/3086 438/424 |
| 9,236,474 | B2 | 1/2016 | Morin et al. | |
| 2006/0214225 | A1 | 9/2006 | Holt et al. | |
| 2009/0321833 | A1* | 12/2009 | Basker | H01L 29/785 257/365 |
| 2011/0227165 | A1* | 9/2011 | Basker | H01L 21/845 257/369 |
| 2011/0291188 | A1* | 12/2011 | Cheng | H01L 29/785 257/347 |
| 2011/0309446 | A1* | 12/2011 | Doris | H01L 21/84 257/351 |
| 2014/0134822 | A1* | 5/2014 | Srinivasan | H01L 29/66795 438/382 |
| 2014/0252469 | A1 | 9/2014 | Lee | |
| 2014/0252483 | A1* | 9/2014 | Nagumo | H01L 21/845 257/351 |
| 2014/0273378 | A1* | 9/2014 | Rodder | H01L 29/66795 438/283 |
| 2014/0299936 | A1 | 10/2014 | Zhang | |
| 2014/0353760 | A1* | 12/2014 | Loubet | H01L 21/82382 257/369 |
| 2015/0028349 | A1 | 1/2015 | Loubet et al. | |
| 2015/0076514 | A1 | 3/2015 | Morin et al. | |

* cited by examiner

FINFETS OF DIFFERENT COMPOSITIONS FORMED ON A SAME SUBSTRATE

BACKGROUND

Technical Field

The technology relates to methods and structures for integrating finFETs of different semiconductor composition and of different conductivity type onto a same wafer. Some of the finFETs may include strained channels.

Discussion of the Related Art

Transistors are fundamental device elements of modern digital processors and memory devices, and have found numerous applications in various areas of electronics including data processing, data storage, and high-power applications. Currently, there are a variety of transistor types and designs that may be used for different applications. Various transistor types include, for example, bipolar junction transistors (BJT), junction field-effect transistors (JFET), metal-oxide-semiconductor field-effect transistors (MOSFET), vertical channel or trench field-effect transistors, and super-junction or multi-drain transistors.

Two types of transistors have emerged within the MOSFET family of transistors that show promise for scaling to ultra-high density and nanometer-scale channel lengths. One of these transistor types is a so-called fin field-effect transistor or "finFET." The channel of a finFET is formed as a three-dimensional fin that may extend from a surface of a substrate. FinFETs have favorable electrostatic properties for complimentary MOS (CMOS) scaling to smaller sizes. Because the fin is a three-dimensional structure, the transistor's channel can be formed on three surfaces of the fin, so that the finFET can exhibit a high current switching capability for a given surface area occupied on substrate. Since the channel and device can be raised from the substrate surface, there can be reduced electric field coupling between adjacent devices as compared to conventional planer MOSFETs.

The second type of transistor is called a fully-depleted, silicon-on-insulator or "FD-SOI" FET. The channel, source, and drain of an FD-SOI FET is formed in a thin planar semiconductor layer that overlies a thin insulator. Because the semiconductor layer and the underlying insulator are thin, the body of the transistor (that lies below the thin insulator) can act as a second gate. The thin layer of semiconductor on insulator permits higher body biasing voltages that can boost performance. The thin insulator also reduces leakage current to the transistor's body region that would otherwise occur in bulk FET devices.

SUMMARY

The described technology relates to methods and structures for integrating finFETs of different chemical compositions and different conductivity types on a same wafer. Some of the finFETs may include strained channel regions (under compressive or tensile strain) that improve the mobility of carriers in the channel. The finFETs may be formed from a same semiconductor material and at a same layer on the wafer. In some embodiments, mandrels are used to guide formation of the fins. FinFETs of different chemical compositions may be formed at a same level on the wafer. Some of the finFETs may be formed of a first semiconductor material and some finFETs may be formed of a semiconductor material that comprises the first semiconductor material which has been converted to a different chemical composition by a conversion process. The converted fins may exhibit strain.

According to some embodiments, a method for making co-integrated finFET structures of different material types on a semiconductor wafer comprises forming trenches in a first semiconductor material on the wafer, wherein the first semiconductor material is in physical contact with a second semiconductor material. The second semiconductor material may be of a different chemical composition than the first semiconductor material. The method may further comprise epitaxially growing fins of the second semiconductor material in the trenches, and converting source, drain, and channel regions of a first plurality of the fins to a chemical composition that includes a chemical species from the first semiconductor material. In some embodiments, the first semiconductor material adjacent the trenches provides mandrels against which the fins are formed. In some aspects, the epitaxially grown fins have a width between about 1 nm and about 30 nm and have a height between about 5 nm and about 100 nm.

According to some aspects, the act of converting source, drain, and channel regions of a first plurality of the fins introduces a chemical species into the fins by a diffusion process. In some implementations, the introduces strain in at least the channel region of the converted fins.

In some implementations, the first semiconductor material is SiGe or SiC and the second semiconductor material is Si. Further, the chemical species that diffuses into the fin is Ge or C, in some implementations.

In some aspects, a method for making co-integrated finFET structures may comprise doping source and drain regions of the first plurality of fins to be of a first conductivity type, and doping source and drain regions of a second plurality of the fins different from the first plurality of fins to be of a second conductivity type different from the first conductivity type. In some aspects, the source and drain regions of the first plurality of fins are doped to be p type and the first semiconductor material comprises SiGe. In some implementations, the source and drain regions of the first plurality of fins are doped to be n type and the first semiconductor material comprises SiC.

According to some implementations, a method for making co-integrated finFET structures comprises forming the first semiconductor material by epitaxial growth, and forming a concentration of the chemical species in the first semiconductor material to be between approximately 30% and approximately 60%.

In some aspects, forming the trenches comprises patterning hard masks using a mandrel process. In some implementations, forming the trenches comprises over etching past the first semiconductor into the second semiconductor. According to some aspects, a method may further comprise forming trench isolation structures adjacent the first plurality of fins.

In some implementations, a method for making co-integrated finFET structures may comprise removing the first semiconductor material from around a second plurality of the fins before converting the source, drain, and channel regions of the first plurality of fins. In some aspects, the first semiconductor material may be removed from around the first plurality of fins.

According to some aspects, a method for making co-integrated finFET structures may comprise removing the first semiconductor material from around a second plurality of the fins before converting the source, drain, and channel regions of the first plurality of fins, removing the first semiconductor material from around the first plurality of fins, and forming gate structures over the first plurality of fins and the second plurality of fins. The method may further include forming electrical interconnects to the source, drain, and channel regions of the first plurality of fins and the second plurality of fins to yield a first plurality of finFETs and a second plurality of finFETs.

In some implementations, a method for making co-integrated finFET structures may comprise doping the first plurality of finFETs to be of a first conductivity type, doping the second plurality of finFETs to be of a second conductivity type, and forming the first plurality of finFETs and the second plurality of finFETs as part of a microprocessor circuit.

The foregoing aspects and implementations of acts to fabricate co-integrated finFET structures may be used in any suitable combination for an embodiment of a method for making co-integrated finFET structures.

In some embodiments, an integrated circuit formed on a single substrate may comprise a first plurality of finFETs having source, drain, and channel regions of a first chemical composition and a first conductivity type, and a second plurality of finFETs having source, drain, and channel regions of a second chemical composition and a second conductivity type. In various embodiments, the second chemical composition differs from the first chemical composition, and the second conductivity type differs from the first conductivity type. In the integrated circuit, the first plurality of finFETs and the second plurality of finFETs may be formed at a same level on the substrate. In some aspects, the first plurality of finFETs and second plurality of finFETs have fin widths between about 1 nm and about 30 nm and have fin heights between about 5 nm and about 100 nm.

In some aspects, the first fins of the first plurality of finFETs and second fins of the second plurality of finFETs are formed from a same layer of material. In some implementations, the first fins and second fins are epitaxial material. In some aspects, the source, drain, and channel regions of the first plurality of finFETs is SiGe or SiC and the source, drain, and channel regions of the second plurality of finFETs is Si.

According to some implementations, the first fins of the first plurality of finFETs and second fins of the second plurality of finFETs are formed from a same material, and the second fins have been converted to include a different chemical species. The conversion may be implemented as a diffusion process. In some aspects, the percentage concentration of the different chemical species in the second fins is between approximately 30% and approximately 60%. In some implementations, the different chemical species is distributed to within 10% uniform concentration throughout the second fins.

In some aspects, the source and drain regions of the first plurality of finFETs are doped to be p type and comprise SiGe. In some aspects, the source and drain regions of the first plurality of finFETs are doped to be n type and comprise SiC.

In some implementations, an integrated circuit further comprises trench isolation structures adjacent the first plurality of fins. In some aspects, the first plurality of finFETs and the second plurality of finFETs are formed in a microprocessor circuit.

The foregoing aspects and implementations of co-integrated finFET structures may be present in any suitable combination in an embodiment of a co-integrated finFET structures. Additionally, any of the above-described method embodiments may be used to fabricate any of the finFET structure embodiments.

The foregoing and other aspects, embodiments, and features of the present teachings can be more fully understood from the following description in conjunction with the accompanying drawings.

BRIEF DESCRIPTION OF THE DRAWINGS

The skilled artisan will understand that the figures, described herein, are for illustration purposes only. It is to be understood that in some instances various aspects of the embodiments may be shown exaggerated or enlarged to facilitate an understanding of the embodiments. In the drawings, like reference characters generally refer to like features, functionally similar and/or structurally similar elements throughout the various figures. The drawings are not necessarily to scale, emphasis instead being placed upon illustrating the principles of the teachings. Where the drawings relate to microfabrication of integrated devices, only one device may be shown of a large plurality of devices that may be fabricated in parallel. The drawings are not intended to limit the scope of the present teachings in any way.

The features and advantages of the embodiments will become more apparent from the detailed description set forth below when taken in conjunction with the drawings.

DETAILED DESCRIPTION

Figure 1A:
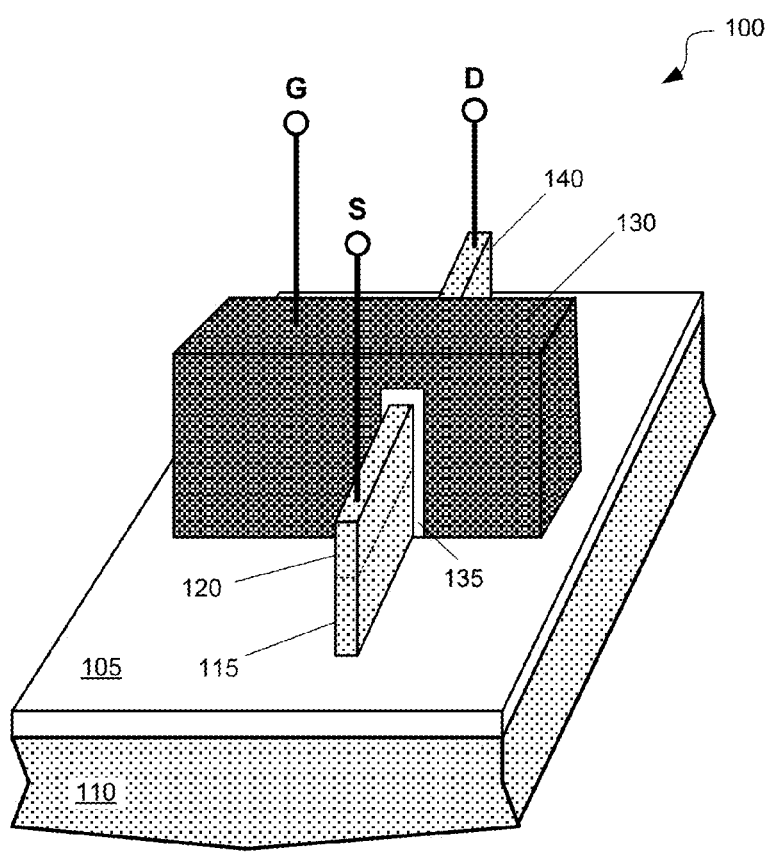
FIG. 1A is a perspective view depicting a finFET, according to some embodiments.

An example of a finFET 100 is depicted in the perspective view of FIG. 1A, according to some embodiments. A finFET may be fabricated on a bulk semiconductor substrate 110, e.g., a silicon substrate, and comprise a fin-like structure 115 that runs in a length direction along a surface of the substrate and extends in a height direction normal to the substrate surface. The fin 115 may have a narrow width, e.g., less than approximately 50 nanometers. There may be an electrically-insulating layer 105, e.g., an oxide layer, on a surface of the substrate 110. The fin may pass through the insulating layer 105, but be attached to the semiconducting substrate 110 at a lower region of the fin. A gate structure comprising a conductive gate material 130 (e.g., polysilicon) and a gate insulator 135 (e.g., an oxide) may be formed over a region of the fin. The finFET may further include a source region 120 and drain region 140 adjacent to the gate. A finFET may also include integrated source S, gate G, drain D, and body B (not shown) interconnects to provide electrical connections to the source, gate, drain, and back body regions of the device.

FinFETs like those depicted in FIG. 1A exhibit favorable electrostatic properties for scaling to high-density, low-power, integrated circuits. Because the fin and channel are raised from the substrate, the devices can exhibit reduced cross-coupling between proximal devices. For the device shown in FIG. 1A, the fin 115 may be formed from the bulk substrate 110 by an etching process, and is therefore attached to the substrate at a base region of the fin, a region occluded in the drawing by the adjacent insulator 105. The insulator

105 may be formed after the etching of the fin 115. Because the fin 115 is attached to the semiconductor substrate, leakage current and cross-coupling may occur via the base region of the fin.

Figure 1B:
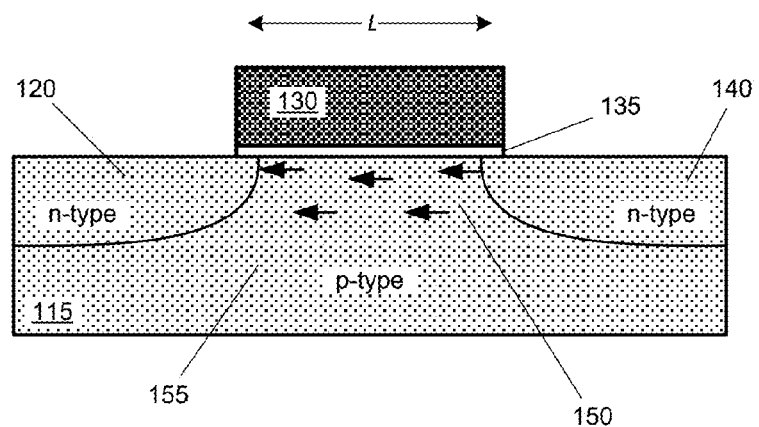
FIGS. 1B-1E depict cross-sectional views of finFET fins, according to various embodiments.
Figure 1C:
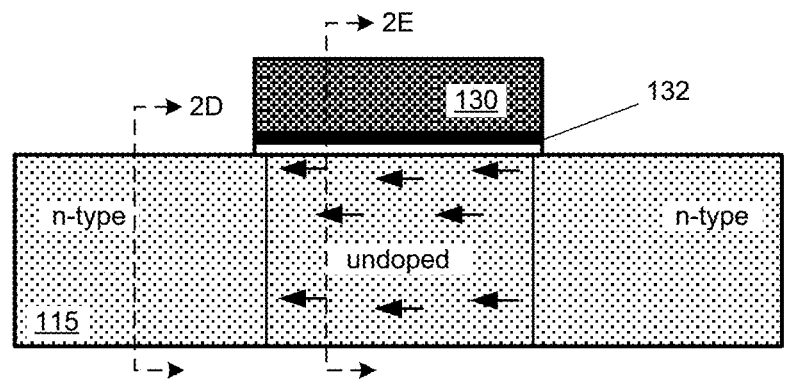

Source, channel, and drain regions of a finFET may be doped with impurities to create different regions of different conductivity types, as depicted in FIGS. 1B-1C. Several different configurations of source, channel, and drain regions are possible. According to some embodiments, source region 120 and drain region 140 may be doped to be of a first conductivity type and the channel region 150 may be doped to be of an opposite conductivity type, as depicted in FIG. 1B. The terms "source region" and "drain region" as used may include extension regions of the fins that lie between source and drain contact regions and the channel region of the finFET device.

Figure 1D:
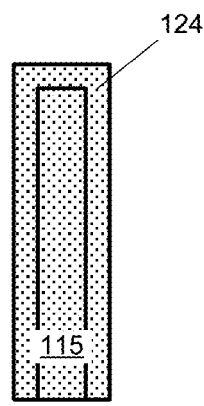

The finFET may further include a body region 155 that may be of a same conductivity type as the channel region. In some embodiments, a channel region 150 of a finFET may be undoped, as depicted in FIG. 1C. The doping of source and drain regions in a finFET may be of various geometries. As depicted in FIG. 1B, vertical portions of the fin 115 may be doped to form source 120 and drain 140 regions, according to some embodiments. Alternatively, outer sheath portions 124 of a fin 115 may be doped to form source and drain regions, as depicted in FIGS. 1C-1E.

Figure 1E:
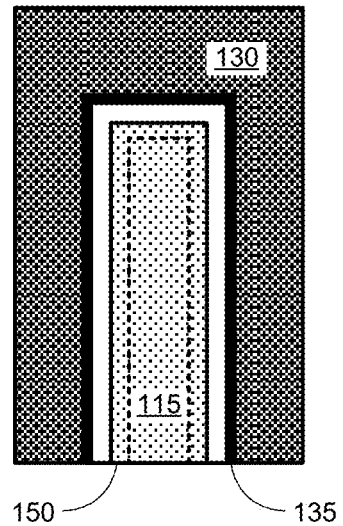

FIG. 1C and FIG. 1E depict a three-dimensional nature of a channel region 150 in a finFET, according to some embodiments. In some embodiments, the entire fin portion encased by the gate structure may be inverted and form a bulk channel rather than a surface channel. A metallic film 132 may be deposited between a gate electrode 130 and gate oxide 135 in some implementations to improve gate conductance and gate switching speeds.

The inventors have conceived of methods and structures for forming integrated finFETs of different chemical compositions and different channel conductivity types on a same substrate or wafer. Additionally, at least some of the finFETs may include strained channel regions (under compressive or tensile strain) that improve carrier mobility within the channels as compared to unstrained channel regions. Strain in a channel region may improve the mobility of carriers in the channel regions, and thereby improve device speed. For example compressive straining of silicon (Si) can improve the mobility of holes within silicon. Tensile straining of Si can improve electron mobility. When enough strain is applied, the performance of silicon-based transistor devices can approach or even surpass the performance of devices based on compound semiconductors (e.g., SiGe, SiC, GaAs, InP, InGaAs, GaN, AlGaAs, etc.), which may require more difficult and expensive processing techniques.

The present methods and structures for forming strained-channel finFETs may be more reliable than other approaches to forming strained-channel finFETs. For example, some other approaches comprise epitaxially growing a layer of semiconductor material of a first composition (e.g., SiGe) on a same wafer that includes a layer of semiconductor of a second composition (e.g., Si). Fins may be patterned at separate or simultaneous times in the two semiconductor materials. This approach can yield undesirable etching profiles and overlay alignment problems. In addition, the thickness and or percent concentration of a straining dopant (e.g., % concentration of Ge) of the semiconductor material of a first composition may be limited to avoid plastic relaxation and formation of defects in that layer. Also, the resulting structure may have a limited thermal budget for subsequent processes, such as shallow trench isolation (STI) processes, so as to avoid relaxation of the fin, defect creation in the fin, and/or diffusion of the straining dopant.

As an overview to the present embodiments, fins for strained-channel finFET devices may be formed on bulk semiconductor wafers or on silicon-on-insulator (SOI) substrates. Fins of different chemical composition may be formed from a same layer of semiconductor material, and at least some of the fins may be converted to a material of a different chemical composition. A strain-inducing material that has a chemical composition different than that of the fin may be patterned with trenches and provide mandrels for forming the fins. The fins may be formed by epitaxy, in which the mandrels guide formation of the fins. A diffusion process may introduce a chemical species from the strain-inducing, mandrel material into the adjacent fins, so as to form strain in the fins. The strain-inducing mandrels may be subsequently removed leaving strained fins. The strained fins may be further processed to form strained-channel finFETs.

Figure 2A:
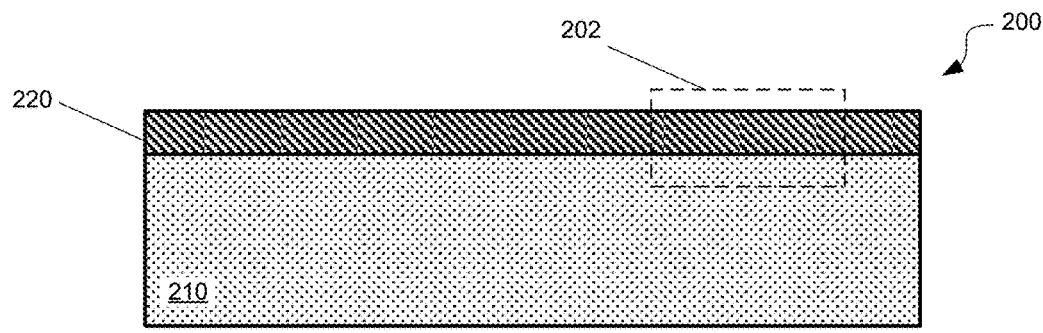
FIGS. 2A-2T depict process steps that may be used to form integrated finFETs of different chemical compositions and different channel conductivity types on a same wafer or substrate, according to some embodiments.
Figure 2B:
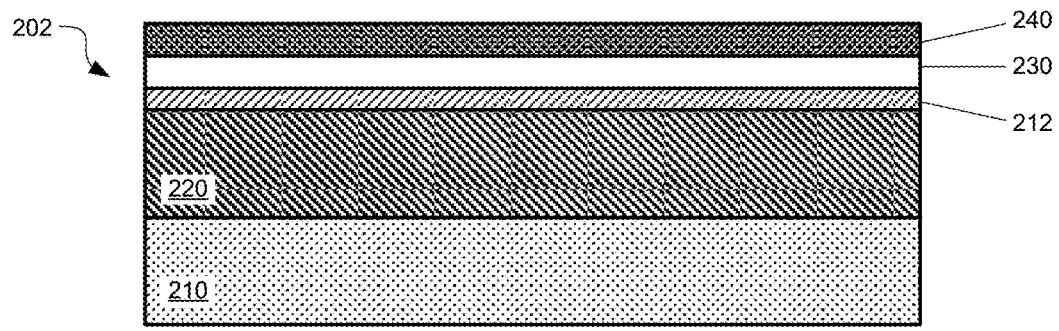
Figure 2C:
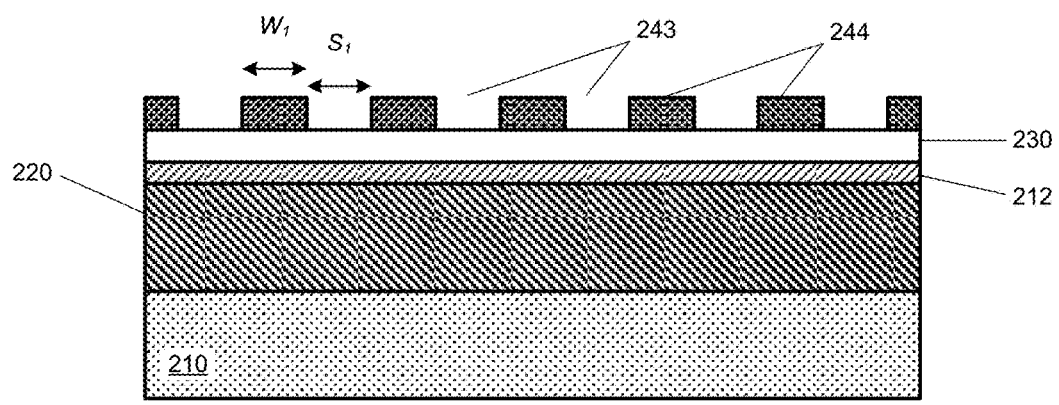
Figure 2D:
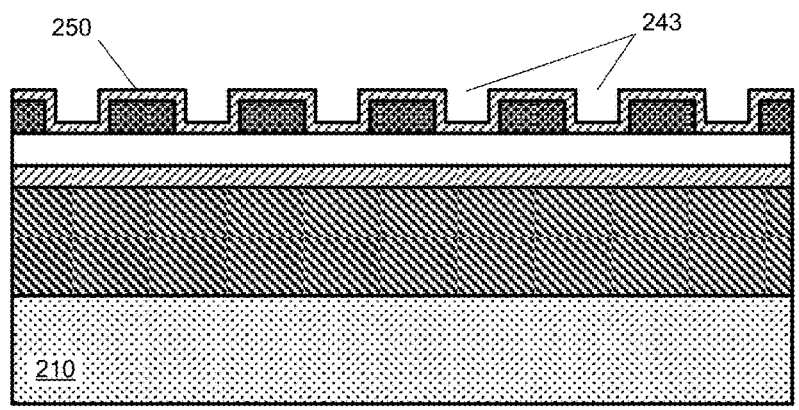
Figure 2E:
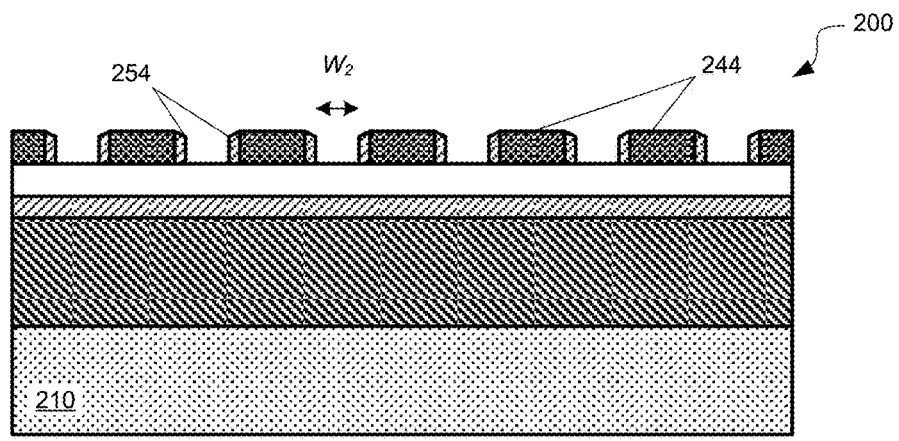
Figure 2F:
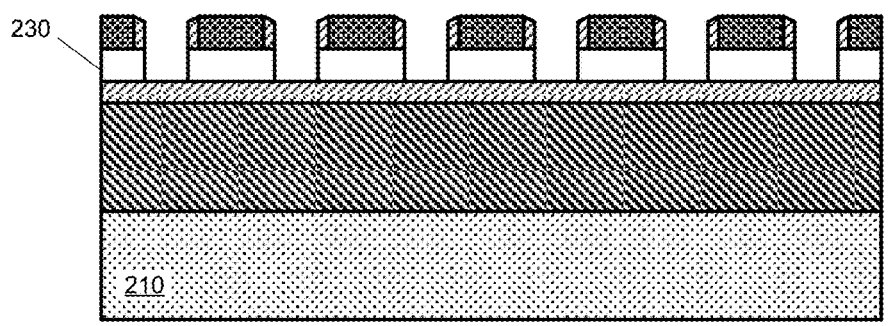
Figure 2G:
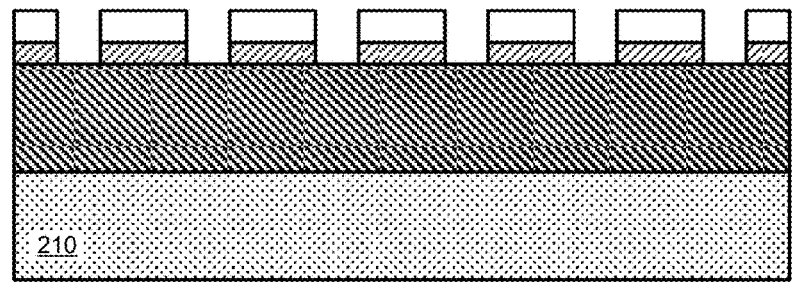
Figure 2H:
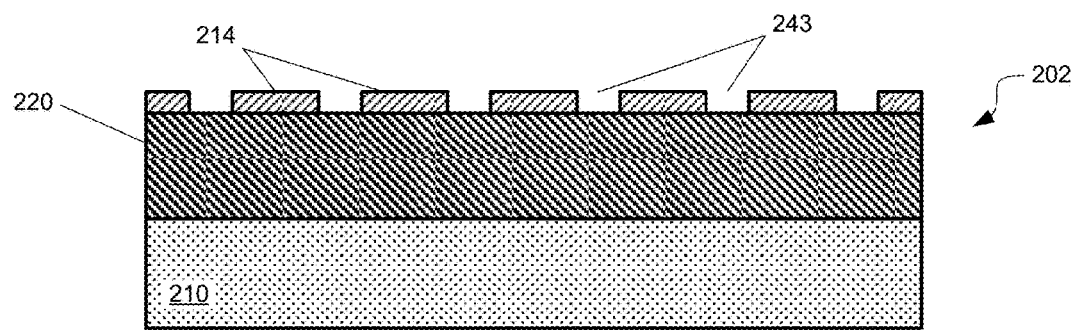
Figure 2I:
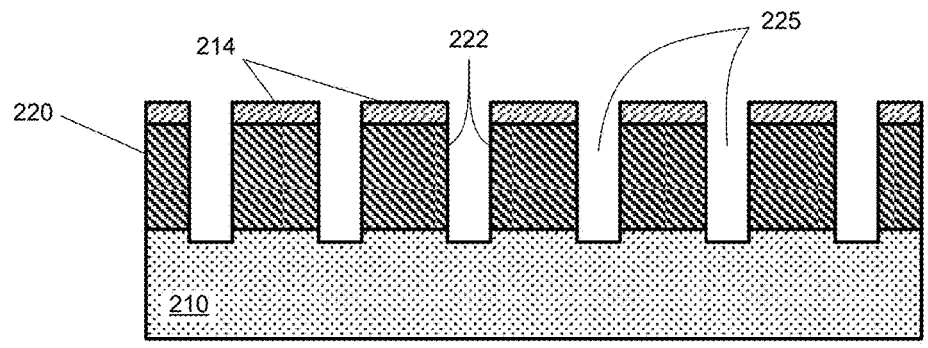
Figure 2J:
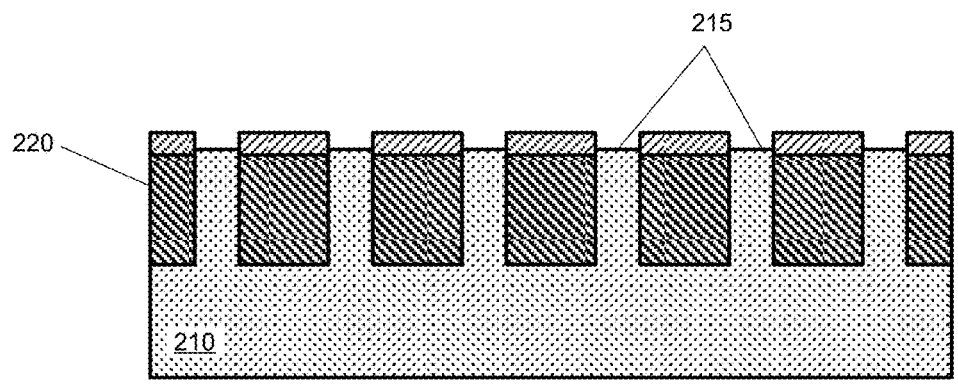
Figure 2K:
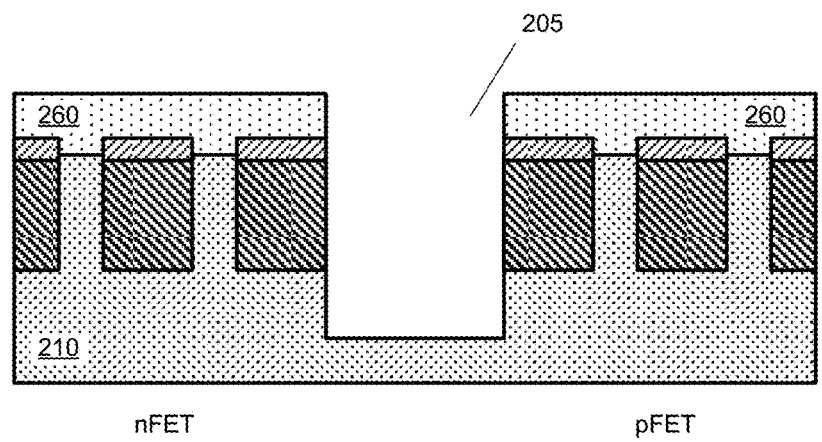
Figure 2L:
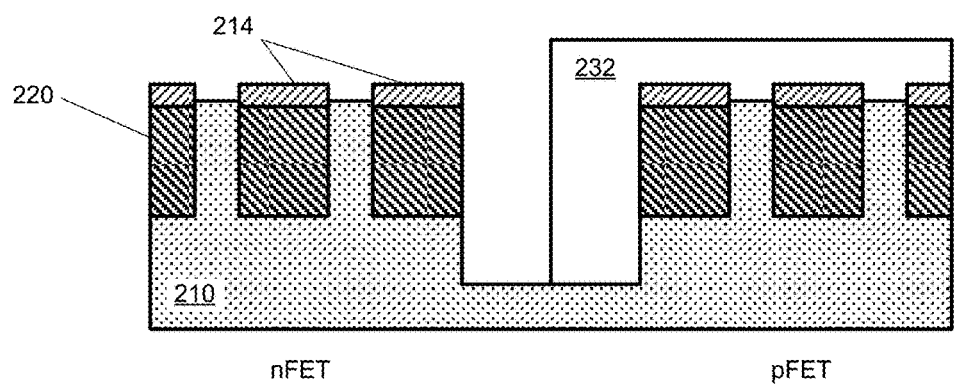
Figure 2M:
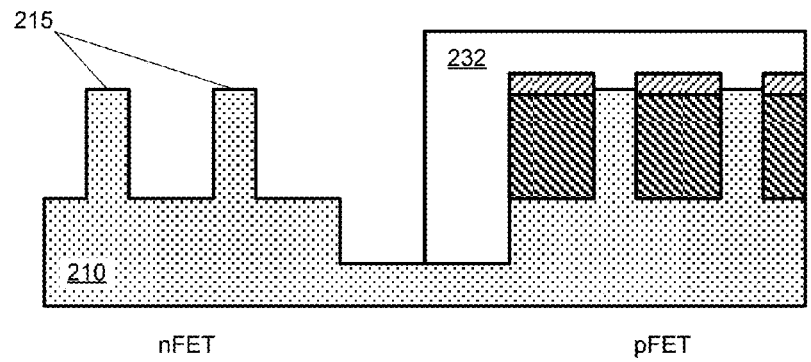
Figure 2N:
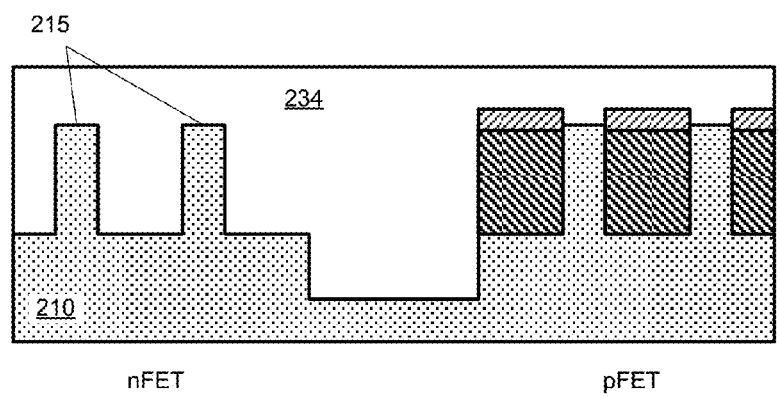
Figure 2O:
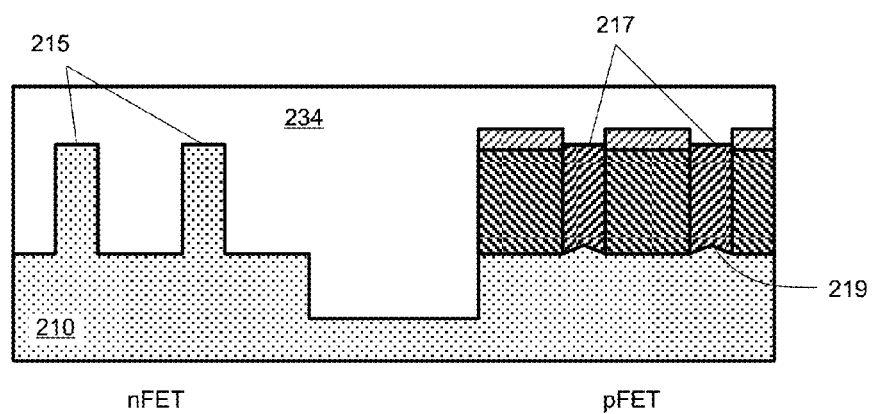
Figure 2P:
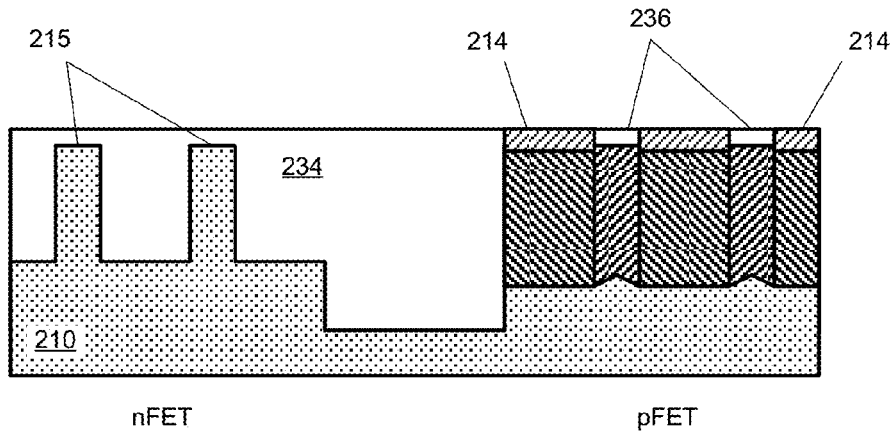
Figure 2Q:
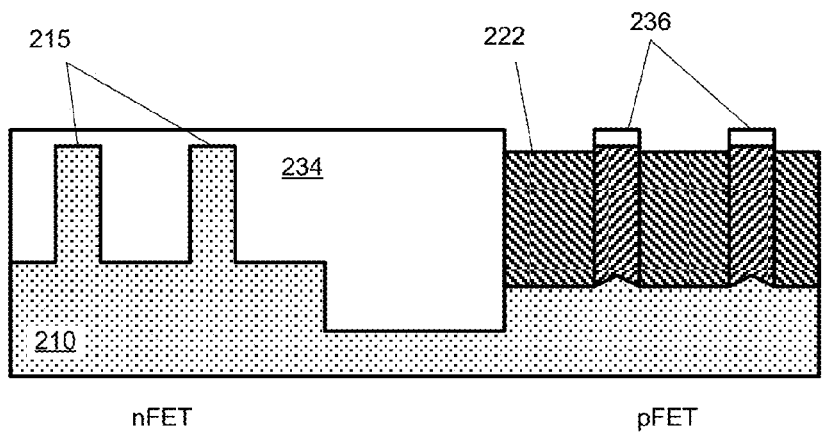
Figure 2R:
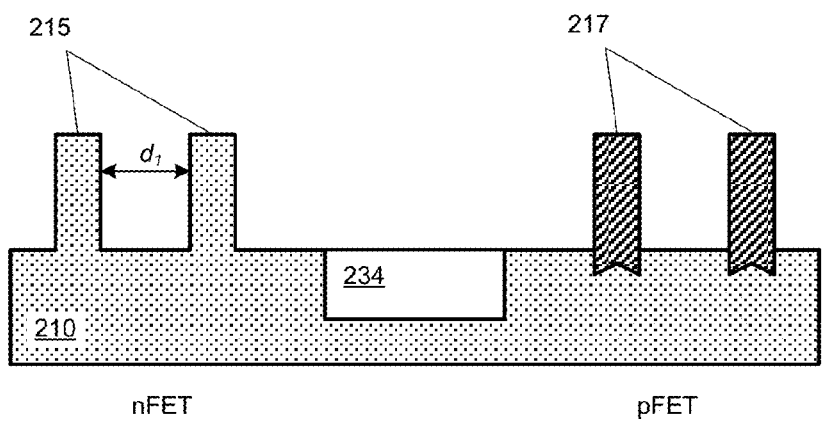
Figure 2S:
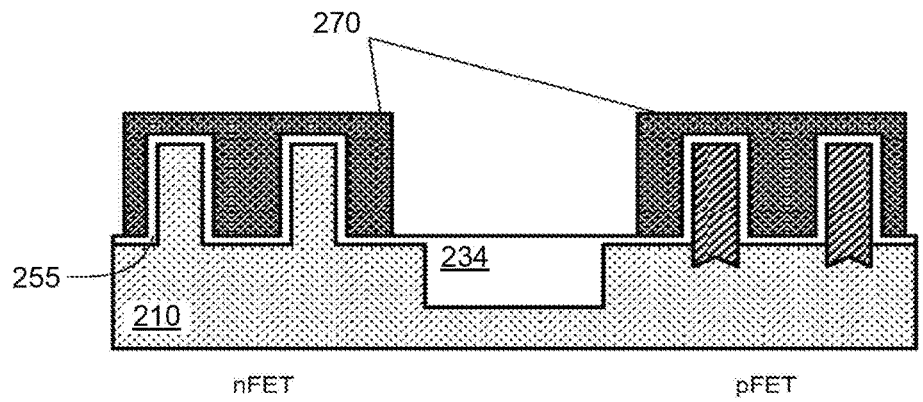
Figure 2T:
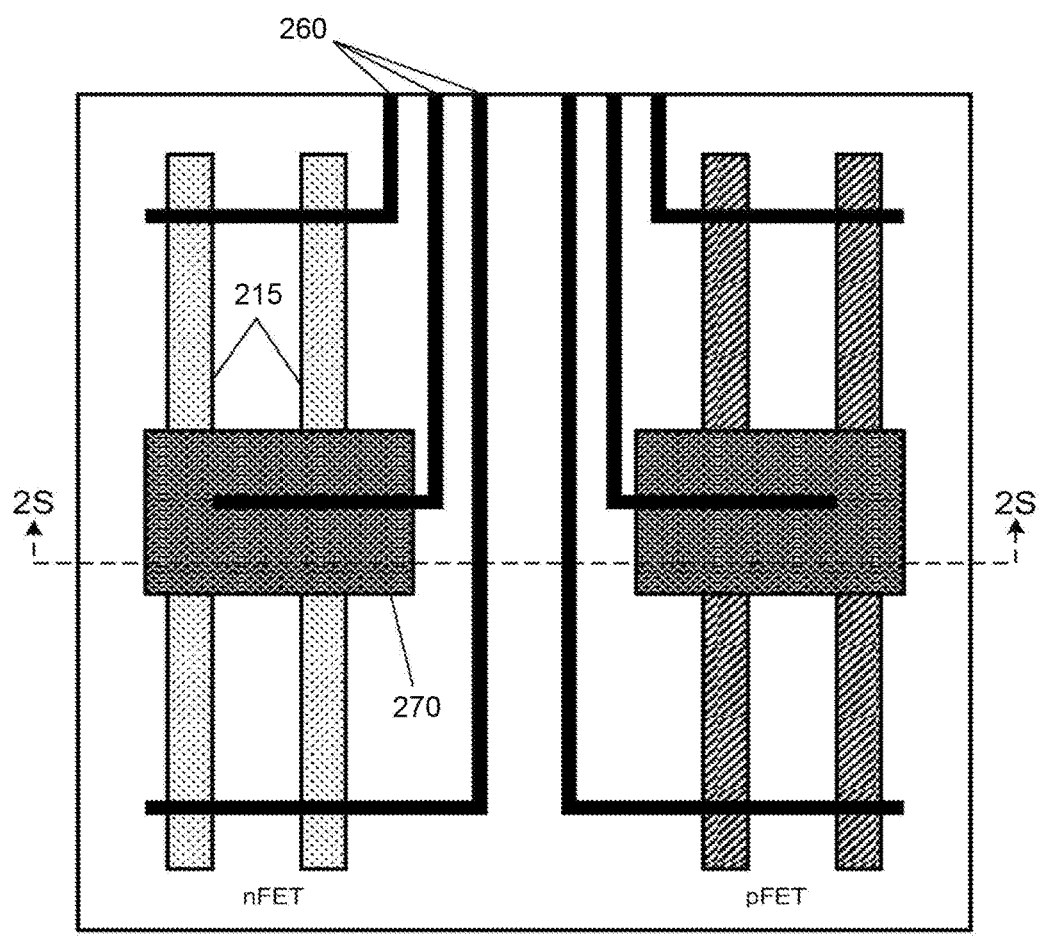

FIGS. 2A-2T depict process steps that may be used to fabricate co-integrated strained-channel finFETs, according to some embodiments. A process for forming strained-channel finFETs may begin with a substrate 200, as depicted in FIG. 2A. In some embodiments, the substrate may comprise a bulk semiconductor substrate 210 of a first type of semiconductor material. The bulk substrate 210 may be any suitable semiconductor (e.g., Si, Ge, GaAs, InP, GaN, SiC, etc.) in some embodiments, or may be a material other than a semiconductor in other embodiments. The substrate may comprise a crystalline semiconductor having a standard orientation of crystal planes, or may have any selected rotated orientation (e.g., (110)).

The substrate 200 may include a layer of second semiconductor material 220 formed over at least one region of the substrate. In some implementations, the layer of second semiconductor material may be formed over the entire area of the substrate. The second semiconductor material 220 may have a different chemical composition from the first semiconductor material 210. For example, the first semiconductor material may be bulk crystalline Si, and the second semiconductor material may be SiGe, though other material combinations may be used in other embodiments. The second semiconductor material may contain a straining dopant (e.g., Ge) that, upon heating, can diffuse into the first semiconductor material. The straining dopant may be present in an atomic percentage between approximately 30% and approximately 60%, according to some embodiments.

In some implementations, the substrate 200 may comprise a semiconductor-on-insulator substrate. The semiconductor may be silicon, and the layer of second semiconductor material may be formed over the silicon. In some embodiments, the substrate 200 may comprise a crystalline material which is not a semiconductor (e.g., diamond) upon which a crystalline semiconductor may be formed.

The layer of second semiconductor material 220 may be epitaxially grown over the substrate 210, according to some embodiments. In other embodiments, the layer of second semiconductor material may be formed by other suitable deposition processes (e.g., atomic layer deposition, plasma deposition, sputtering) and may not be of high crystalline quality. The layer of second semiconductor material 220 may include a chemical species (e.g., Ge according to the example above) that can diffuse into the first semiconductor material upon thermal processing. The layer of second semiconductor material 220 may be grown to a thickness between about 5 nm and about 150 nm, according to some embodiments.

Fins for finFET devices may be formed from a same layer and at a same level on the substrate using lithography and epitaxy processes, according to some embodiments. For example, the fins may be formed from a surface of the first semiconductor material 210, and the patterns to guide formation of the fins may be established in the second semiconductor material 220 using any suitable high-resolution lithographic process. For example, trenches may be formed in the second semiconductor material 220 to at least the surface of the first semiconductor material 210, and the fins may be epitaxially grown from the first semiconductor material. The trenches may define the fin structures.

One example of a high-resolution lithographic process that may be used to pattern trenches in the second semiconductor material 220 is an adapted mandrel process described in FIGS. 2B-2I, though other lithographic techniques may be used in other embodiments. In some embodiments, the steps depicted in FIGS. 2B-2G may be omitted, and a hard mask 214 (shown in FIG. 2H) may be patterned directly using any suitable a high-resolution lithography technique or techniques, e.g., deep-ultraviolet photolithography, extreme-ultraviolet lithography (EUV), resolution-enhancement techniques, etc. Other lithographic techniques may include other variations of a mandrel or sidewall-image-transfer process, interferometric lithography, imprint lithography, high-resolution forms of photolithography, x-ray lithography, as well as process biasing techniques.

In some embodiments, a sidewall image transfer (SIT) process may be used to pattern narrow lines that may be used to form trenches. In some implementations, an image reversal process may be used in combination with an SIT process to obtain patterns for narrow trenches. An SIT process may be referred to as a self-aligned double patterning (SADP) process. In some implementations, the narrow trenches may be formed using a double patterning process, e.g., resist-on-resist patterning techniques (which may include a lithography-etch-lithography-etch (LELE) process or a lithography-freeze-lithography-etch (LFLE) process).

According to an adapted mandrel or SIT process, in at least a region 202 of the substrate 200, several resist layers may be formed at a surface of the substrate, as depicted in FIG. 2B. The term "resist" may include soft resists (e.g., polymers, photoresists, etc.) as well as hard resists (e.g., oxides, nitrides, etc.). Because a conventional mandrel or SIT process normally patterns resist masks as narrow lines separated by larger vias, the process may be adapted to provide narrow vias between larger resist masks for forming trenches. The resist layers may include a first hard mask layer 212 that exhibits chemical etch selectivity over the second semiconductor layer 220. For example, a suitable etch recipe may be used such that the second semiconductor layer 220 etches at least twice as fast as the first hard mask layer 212 when exposed to the same etching conditions. In some embodiments, the first hard mask layer may be silicon nitride (e.g., SiN or $Si_3N_4$), though other materials (such as oxides or silicides) may be used in other embodiments.

A second hard mask layer 230 may be formed over the first hard mask layer, and the second hard mask layer may exhibit etch selectivity over the first hard mask layer, according to some implementations. In some embodiments, the second hard mask layer 230 may be an oxide layer (e.g., $SiO_x$ or $SiO_2$), though other materials may be used in other embodiments. A third hard mask layer 240 may be formed over the second hard mask layer, and may exhibit etch selectivity over the second hard mask layer. In some embodiments, the third hard mask layer may be poly-Si, though other materials may be used in other embodiments.

The thicknesses of each of the first through third hard mask layers may be between approximately 10 nm and approximately 100 nm.

The terms "approximately," "substantially," and "about" may be used to mean within ±20% of a target dimension in some embodiments, within ±10% of a target dimension in some embodiments, within ±5% of a target dimension in some embodiments, and yet within ±2% of a target dimension in some embodiments. The terms "approximately," "substantially," and "about" may include the target dimension.

According to some embodiments, the third hard mask layer 240 may be patterned using any suitable high-resolution lithographic process. The patterning of the third hard mask layer 240 may include deposition and patterning of a polymeric resist, and transfer of that pattern, via anisotropic etching, into the third hard mask layer. The resist may be patterned using photolithography, in some embodiments. The etching may stop at the second hard mask layer 230. According to some embodiments, it is easier to pattern a grating structure having equal lines and spaces, as depicted in FIG. 2C, though the patterned layer 240 may not have equal lines and spaces in other embodiments. In some implementations, the width $W_1$ of the patterned lines 244 may be between about 10 nm and about 150 nm. The width $S_1$ of the spaces 243 may be between about 10 nm and about 150 nm. In some embodiments, the width of the spaces 243 is less than the width of the lines 244 ($S_1 < W_1$).

A film 250 may be conformally deposited over the surface of the substrate, covering the lines 244 as shown in FIG. 2D. The film 250 may be deposited by any suitable deposition process, e.g., conformal plasma deposition, chemical vapor deposition, atomic layer deposition, etc. In various embodiments, the thin film 250 exhibits etch selectivity over the second hard mask layer 230. According to some embodiments, the film 250 may be a nitride film. The thickness of the film 250 may be between about 2 nm and about 70 nm, according to some embodiments. The film may act to narrow the spaces 243.

A timed anisotropic etch (e.g., a timed reactive ion etch (RIE)) may then be used to remove horizontal portions of the film 250, but not remove vertical portions 254 on the sidewalls of the lines 244, as depicted in FIG. 2E. The vertical portions 254 may be referred to as spacer structures, and the process used to form the vertical portions may be referred to as a spacer process. The presence of the spacers 254 narrows the spaces $S_1$ to a dimension $W_2$ between the lines 244, and the thickness of the thin film 250 may be selected to provide a desired dimension $W_2$. As will be seen in subsequent processing, the dimension $W_2$ substantially determines a width of the finFET fins.

The substrate 200 may then be subjected to a series of etching steps. An anisotropic etch may be used to etch the second hard mask layer 230, as depicted in FIG. 2F. This etch transfers the pattern defined by the lines 244 and spacers 254 into the second hard mask layer. A subsequent anisotropic etch may be used to transfer the pattern into the first hard mask layer 214, as depicted in FIG. 2G. This subsequent etch may remove some or all of the lines 244 and spacers 254 in some embodiments. In some implementations, the second hard mask layer structures may be removed yielding the substrate depicted in FIG. 2H.

Although one method has been described to form the structures depicted in FIG. 2H, any other suitable lithographic technique may be used. As described above, in some embodiments, the first hard mask layer 214 may be patterned directly using high-resolution lithography techniques that are capable of providing a patterning resolution on the order of the desired fin width (e.g., capable of patterning the narrow spaces 243). In some embodiments, a variation of the adapted mandrel process depicted in FIGS. 2B-2H may be used. In this variation, the second hard mask layer 230 may be omitted, and the film 250 may be formed of a material that exhibits etch selectivity over the first hard mask layer 214 and the third hard mask layer 240. For example, the first hard mask layer may be nitride, the third hard mask layer may be polysilicon, and the film may be an oxide.

Regardless of how the first hard mask layer is patterned as depicted in FIG. 2H, the substrate may then be subjected to a trench etch to form fin trenches 225 that are depicted in FIG. 2I. The patterned first hard mask layer 214 substantially defines the shape and orientation with respect to crystal axes of the semiconductor material 210 of the etched trenches. The trenches may extend a length L (into the page) between approximately 100 nm and approximately 1 micron, though shorter or longer lengths may be implemented in some embodiments. These fin trenches 225 and surrounding mandrels 222 of the second semiconductor material 220 may guide subsequent formation of the fins. According to some embodiments, the fin trenches 225 extend through the second semiconductor material 220, and expose the first semiconductor material 210. In some implementations, the fin trenches 225 extend into the first semiconductor material 210, as depicted in FIG. 2I. The fin trenches may extend into the first semiconductor material a distance between approximately 5 nm and approximately 30 nm, in some embodiments.

The orientation of the trenches 225 with respect to the crystal planes of first semiconductor material 210 may be selected to increase carrier mobility in a strained channel of the subsequently formed fins. For example, some orientations of strain with respect to crystal planes increases carrier mobility more than other orientations of strain. In some implementations, the trenches are oriented so as to maximize mobility enhancement due to strain.

Fins 215 of the first semiconductor material may be epitaxially grown from the exposed surfaces of the first semiconductor material in the fin trenches, as depicted in FIG. 2J. Fin growth may also proceed laterally form exposed sidewall surfaces of the second semiconductor material 220. The fins may be grown to a level that is approximately equal to the upper level of the second semiconductor layer 220. In some embodiments, the fins may be grown to a level that is less than the upper level of the second semiconductor layer 220. In some embodiments, the fins may be grown to a level that is slightly more than the upper level of the second semiconductor layer 220. Because of the epitaxial growth and confinement by the fin trenches 225, the fins are of high crystal quality and the tops of the fins may have substantially flat surfaces. The defect density in the epitaxially-grown fins may be less than about $10^5$ defects/cm$^2$ in some embodiments, less than about $10^4$ defects/cm$^2$ in some embodiments, less than about $10^3$ defects/cm$^2$ in some embodiments, less than about $10^2$ defects/cm$^2$ in some embodiments, and yet less than about 10 defects/cm$^2$ in some embodiments.

According to some embodiments, a shallow trench isolation (STI) process may be carried out to define and electrically isolate different regions on the substrate. The STI process may comprise depositing and patterning a photoresist 260 on the substrate, and anisotropically etching isolation trenches 205 in patterned opening of the resist, as depicted in FIG. 2K, in some implementations. According to some embodiments, a hard mask may be used instead of a photoresist for the etching. In some embodiments, the isolating trenches 205 may be used to isolate regions of the substrate allocated for nFET devices from regions allocated for pFET devices. The photoresist 260 may be stripped from the substrate, and a hard mask material (e.g., an oxide or nitride) deposited over the entire area (not shown in FIG. 2K). The hard mask material may comprise insulating material that may remain in the isolation trench 205, in some embodiments. The hard mask material may overfill the isolation trenches 205, and subsequently be planarized by a chemical-mechanical polishing (CMP) process. The hard mask material may exhibit etch selectivity over the first hard mask layer 214, the second semiconductor layer 220, and the first semiconductor material 210.

The hard mask may be patterned to protect one region (e.g., a pFET region) and expose another region (e.g., an nFET region). For example, photoresist may be deposited over the hard mask material and patterned to expose the hard mask material over the nFET region. A subsequent anisotropic etching process may be used to remove the hard mask material from the nFET region, and leave the hard mask material 232 over the pFET region as depicted in FIG. 2L. According to some embodiments, when a hard mask is used instead of a photoresist at the step corresponding to FIG. 2K, the hard mask may be removed from only a portion of the substrate to yield a structure similar to that shown in FIG. 2L.

A subsequent sequence of etch steps may then be used to remove the first hard mask layer 214 and the second semiconductor layer 220 or mandrels in the exposed region, as depicted in FIG. 2M. The etching may be anisotropic or isotropic, and may include wet and/or dry etch steps. For example, the hard mask layer 214 (if formed of silicon nitride) may be selectively removed in the exposed region using a wet phosphoric acid ($H_3PO_4$) etch, and the second semiconductor layer 220 (if formed of SiGe) may be selectively removed with an hydrochloric (HCl) etch using dry or wet etching. After the etching in the exposed region, fins 215 of the first semiconductor composition protrude from the substrate 210. These fins may not be strained.

Additional hard mask material 234 may be deposited on the substrate and planarized to obtain a structure depicted in FIG. 2N. The hard mask material 234 can provide stabilizing support for the protruding fins 215 during a subsequent heating step, and may comprise the same material as hard mask material 232. In some embodiments, the additional hard mask material 234 may be deposited, but not planarized before a subsequent heating step.

The substrate may then be heated, so as to diffuse a straining dopant (e.g., Ge) in the second region (e.g., the pFET region) into the fins in that region. This heating step can transform the fins in that region into fins 217 of a strained material having a chemical composition different from that of the fins 215 in the first region (e.g., the nFET region). The converted fins 217 are depicted in FIG. 2O. For diffusion, the substrate may be heated to a temperature between about 800° C. and about 1500° C., in some embodiments. In some implementations, the substrate may be heated to a temperature between about 1000° C. and about 1200° C. to diffuse the straining dopant. Because the fin is narrow, heating times for diffusion may be short, e.g., less than 5 minutes in some embodiments, less than 2 minutes in some embodiments, and yet less than 1 minute in some embodiments.

According to some embodiments, a concentration of straining dopant in the converted fin 217 may be highly uniform throughout the fin. For example, the concentration of the straining dopant may vary by less than about ±10% throughout the fin. Because the fin may be narrow, e.g., less than 50 nm wide, and surrounded on both sides by the mandrels, the straining dopant from the mandrels does not need to diffuse more than about 25 nm in fin widths about 50 wide. As may be appreciated, the diffusion distance is even less in narrower fins, e.g., about 5 nm in fin widths of about 10 nm. There may be no significant concentration gradient of the strain-inducing dopant in the fins.

In some embodiments, a concentration of straining dopant may be higher (for a given level of defect density in the fin) than what would be possible if the fin itself of the same chemical composition were epitaxially grown from a planar substrate surface having a lattice mismatch. For example and for a SiGe fin epitaxially grown from a Si substrate, a concentration of Ge in the epitaxy can determine how high the fin may be grown before plastic relaxation and unacceptable defect concentrations occur. Unacceptable defect concentrations may be values greater than about $10^5$ defects/$cm^2$ in some embodiments. As an example, a Ge concentration of 30% may limit the fin height of an epitaxial grown SiGe fin or epitaxial layer to about 40-50 nm for acceptable defect levels. Beyond this height, the defect concentration may become unacceptable for IC devices. A method to avoid high defect levels is to vary the dopant concentration of the Ge as the fin or layer from which it is formed is epitaxially grown. This results in a dopant gradient in the fin.

In embodiments of this disclosure, a fin is epitaxially grown from the same material as the substrate 210 in a high-aspect-ratio trench 225, and is subsequently converted to include a straining dopant. Because the fin is grown from a same material, the fin can be formed with defect levels below $10^5$ defects/$cm^2$ before conversion. Before conversion, the defect levels of the epitaxially grown fin may be less than $10^4$ defects/$cm^2$ in some embodiments, less than $10^3$ defects/$cm^2$ in some embodiments, less than $10^2$ defects/$cm^2$ in some embodiments, and yet less than 10 defects/$cm^2$ in some embodiments. After conversion, the defect level may increase by an order of magnitude, and the doping profile may be highly uniform throughout the fin, since the dopant enters the fin from both sides of the narrow fin structure. Further, the height of the epitaxial grown fin may be higher and a concentration of the straining dopant may be higher for an acceptable level of defects. For example, fin heights of up to 75 nm may be obtained at a Ge concentration of up to 30% with a defect concentration less than or equal to $10^5$ defects/$cm^2$ according to some embodiments, fin heights of up to 75 nm may be obtained at a Ge concentration of up to 40% with a defect concentration less than or equal to $10^5$ defects/$cm^2$ according to some embodiments, fin heights of up to 75 nm may be obtained at a Ge concentration of up to 50% with a defect concentration less than or equal to $10^5$ defects/$cm^2$ according to some embodiments, and yet fin heights of up to 75 nm may be obtained at a Ge concentration of up to 60% with a defect concentration less than or equal to $10^5$ defects/$cm^2$ according to some embodiments.

In some implementations, diffusion of the straining dopant may not provide a uniform concentration of the dopant across the fin or across the base of the fin. For example, the concentration of diffused straining dopant may be higher at the sidewalls of the fin, and lower at the center of the fin. There may be a spatially variable concentration profile 219 at the base of the converted fins 217, as depicted in FIG. 2O. In other embodiments, the concentration profile may extend uniformly across the base of the fins, without substantial vertical variation. In some embodiments, the straining dopant may diffuse downward below the base of the fin, converting some of the substrate 210, as depicted in FIG. 2P.

According to some embodiments, the substrate 200 may be planarized using a CMP process and slurry selected so that the polishing stops on the first hard mask layer 214 in the second region. The resulting planarized structure including the first and second regions is depicted in FIG. 2P. The CMP process may expose the surfaces of the first hard mask layer 214. Additionally, hard masks 236 remaining from the hard mask material 234 may cover the fins 215. According to some embodiments, the hard masks 236 are formed of an oxide, whereas the first hard mask layer 214 is formed of a nitride, though other material combinations may be used in other embodiments.

The remaining first hard mask layer 214 may be removed with a selective wet or dry etching step, as depicted in FIG. 2Q, according to some implementations. In some embodiments, the etch may comprise a wet phosphoric acid etch. The removal of the first hard mask layer 214 may expose the mandrels 222 of the second semiconductor layer 220, in the second region of the substrate. The mandrels 222 may then be removed with a selective anisotropic etch. For this etch, the hard masks 236 function as a resist protecting the converted fins 217. Subsequently, the hard masks 236 may be removed and the hard mask layer 234 may be etched back to expose the converted and strained fins 217 and the unstrained fins 215, as illustrated in FIG. 2R. Insulating material may remain as a trench isolation structure between the regions of different fins.

According to some embodiments, a gate insulator 255 (e.g., a gate oxide or nitride) and gate conductors 270 may be formed over at least some of the fins, as depicted in FIG. 2S. The gate insulator 255 may be formed by a thermal oxidation process, a physical deposition process, or a chemical deposition process. In some embodiments, the gate insulator may be formed by atomic layer deposition. The gate conductors 270 may be formed of polysilicon, though any suitable gate conductor material may be used. Gate conductors may be formed using blanket deposition, photolithography, and etching processes. In some implementations, the patterned gate conductors may serve as a mask for removing gate insulation material 255 adjacent the gate conductors (e.g., from source and drain regions of the fins), and may be used as self-aligned masks for doping source and drain regions of the fins by ion implantation. Gate, source, and drain contacts and interconnects (generally designated 260 in FIG. 2T) may be formed using any suitable microfabrication techniques, so as to provide electrical connections to the gate, source, and drain regions of the finFETs.

The resulting finFET structures shown in FIGS. 2S-2T, illustrate finFETs of two different material compositions and strains formed on a same substrate and at a same layer. The two different finFET compositions may comprise two different conductivity types. For example, the unstrained finFETs 215 may be formed of Si and doped to produce n-channel finFETs, and the converted finFETs 217 may comprise SiGe and are doped to produce p-channel finFETs. In such an embodiment, the p-channel devices are under compressive strain and the mobility of carriers in the channel is increased.

In some embodiments, additional finFETs may be formed on the same substrate having a third composition different from the other two compositions. For example and referring back to FIG. 2A, the second semiconductor layer 220 may be formed at a first region of the substrate at a first time, while a second region of the substrate is masked preventing epitaxy of the second semiconductor layer. The second semiconductor layer may comprise SiGe, for example. At a later time, the first region of the substrate may be masked, and the second region exposed for epitaxy of a different material (SiC, for example) at the same level as the SiGe. The different regions may then be subjected to the same processing that is depicted in FIGS. 2B-2T. The second region of the substrate may then include converted fins having a SiC composition that places those fins under tensile strain. These tensilely strained fins may be doped to form n-channel devices.

The choice of fin orientation with respect to the semiconductor's crystal planes may be selected to further increase carrier mobility in the channel regions. Because changes in mobility due to strain can also depend on crystal orientation, some orientations of fin directions with respect to crystalline planes may be preferred over other orientations to increase carrier mobility in the channel region.

The embodiments described above show the finFETs being formed on a bulk semiconductor substrate. It will be appreciated that the finFETs may also be formed on silicon- or semiconductor-on-insulator (SOI) substrates.

According to some embodiments and referring to FIG. 2J, the fins 215 grown between the mandrels of material need not be the same material as the substrate 210. For high aspect ratios of the trenches 225, trapping of defects may occur, so that the fins are formed with a defect density that is suitable for IC applications. For example, the defect density may be less than about $10^5$ defects/cm$^2$ in an active region of the finFET.

According to some embodiments, the fins formed according to the described embodiments may be doped with an acceptor or donor species that determines a conductivity type (p or n) of the source and drain or channel regions. In some implementations, the second semiconductor layer 220 may be doped with an acceptor or donor species that diffuses into the fin during the fin conversion process. In some embodiments, source, drain, and channel regions may be doped by ion implantation or other methods. As an example, and referring to FIG. 2T, source and drain regions may be doped by ion implantation after formation of the gate conductor 270, wherein the gate conductor provides a self-aligned mask to shield the channel region from donor or acceptor dopants. In some implementations, the channel region may not be doped.

Although the examples described above are primarily directed to Si/SiGe semiconductor combinations, other semiconductor combinations may be used in other embodiments. For example, equivalent process steps may be implemented for GaAs, GaN, InP, GaN, InGaAs, InGaN, and other semiconductor materials.

Although the processing steps depicted in FIGS. 2A-2T illustrate some embodiments for forming co-integrated finFETs, in other embodiments, there may be additional, alternative, or fewer steps.

The fins shown in the drawings may be spaced laterally from each other on one or more regular spacing intervals. For example, there may be a uniform lateral spacing $d_1$ between all fins. Alternatively, there may be two uniform lateral spacings $d_1$, $d_2$ alternating between successive fins. The fins may have a width between approximately 1 nm and approximately 30 nm. The fins may all be of substantially a same width. In some implementations, there may be variations in fin widths over an area of the wafer, wherein the variations are more than about 20% of an average fin width. The fins may be spaced apart between approximately 10 nm and approximately 50 nm. There may be one or more fins per finFET device. A finFET device fabricated according to the present teachings may be formed in an integrated circuit in large numbers and at high densities. The circuits may be used for various low-power applications, including but not limited to, circuits for operating smart phones, computers, tablets, PDA's and other consumer electronics.

Although the foregoing methods and structures are described in connection with "finFETs," the methods and structures may be employed for variations of finFET devices in some embodiments. For example, according to some implementations, the methods and structures may be employed for the fabrication of tri-gate, pi-gate, or omega-gate transistors. In some embodiments, the methods and structures may be employed for the fabrication of gate-all-around (GAA) transistors.

The technology described herein may be embodied as a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments. Additionally, a method may include more acts than those illustrated, in some embodiments, and fewer acts than those illustrated in other embodiments.

Although the drawings depict one or a few transistor structures, it will be appreciated that a large number of transistors can be fabricated in parallel following the described semiconductor manufacturing processes. The transistors may be incorporated as part of microprocessing or memory circuitry for digital or analog signal processing devices. The transistors may be incorporated in logic circuitry, in some implementations. The transistors may be used in consumer electronic devices such as smart phones, computers, televisions, sensors, microprocessors, microcontrollers, field-programmable gate arrays, digital signal processors, application specific integrated circuits, logic chips, analog chips, and digital signal processing chips. For example, transistors such as those depicted in FIG. 2T may be incorporated into microprocessor circuitry.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A method comprising:
   forming mandrels on a semiconductor substrate, the mandrels made of a first semiconductor material;
   forming fins made of a second semiconductor material on the substrate after forming the mandrels, each of the fins being sandwiched between and in abutting contact with sidewalls of a respective pair of the mandrels, the second semiconductor material having a different chemical composition than the first semiconductor material; and
   converting a first plurality of the fins to a chemical composition that includes a chemical species from the mandrels.

2. The method of claim 1, wherein the converting comprises introducing the chemical species from the mandrels to adjacent portions of the fins by a thermal diffusion process.

3. The method of claim 1, wherein the converting introduces strain in at least a channel region of each of the fins.

4. The method of claim 1, wherein the first semiconductor material is SiGe or SiC and the second semiconductor material is Si.

5. The method of claim 4, wherein the chemical species includes one or more of Ge or C.

6. The method of claim 1, further comprising:
doping source and drain regions of the first plurality of fins to be of a first conductivity type; and
doping source and drain regions of a second plurality of the fins to be of a second conductivity type opposite that of the first plurality of the fins.

7. The method of claim 6, wherein the source and drain regions of the first plurality of fins are doped to be p type and the first semiconductor material comprises SiGe.

8. The method of claim 6, wherein the source and drain regions of the first plurality of fins are doped to be n type and the first semiconductor material comprises SiC.

9. The method of claim 1, wherein:
the fins are formed by epitaxial growth.

10. The method of claim 1, wherein the fins have a width between about 1 nm and about 30 nm and have a height between about 5 nm and about 100 nm.

11. The method of claim 1, wherein forming the fins comprises patterning hard masks using a sidewall image transfer process.

12. The method of claim 1, wherein forming the fins comprises over etching past the first semiconductor material into the semiconductor substrate.

13. The method of claim 1, further comprising forming trench isolation structures adjacent the first plurality of fins.

14. The method of claim 1, further comprising, prior to the converting, removing the first semiconductor material from around a second plurality of the fins.

15. The method of claim 1, further comprising removing the mandrels.

16. The method of claim 6, further comprising:
removing the first semiconductor material from around the second plurality of the fins before converting the first plurality of the fins;
removing the first semiconductor material from around the first plurality of the fins;
forming gate structures over the fins; and
forming electrical interconnects to the sources, drains, and gate structures to yield finFETs.

17. The method of claim 16, further comprising:
forming the first plurality of finFETs and the second plurality of finFETs as part of a microprocessor circuit.

18. A method, comprising:
forming, on a semiconductor substrate made of a first semiconductor material, a layer of a second semiconductor material;
forming trenches in the second semiconductor material, the trenches exposing surfaces of the first semiconductor material;
forming, in the trenches, fins made of the first semiconductor material, the fins having left and right sidewalls in physical contact with the second semiconductor material; and
converting a first plurality of the fins to a chemical composition that includes a chemical species originating in the second semiconductor material.

19. The method of claim 18, wherein the converting comprises introducing the chemical species into the fins by a thermal diffusion process through the left and right sidewalls of the fins.

20. The method of claim 18, wherein the second semiconductor material is SiGe or SiC and the first semiconductor material is Si.

21. The method of claim 18, wherein the chemical species includes one or more of Ge or C.

22. The method of claim 18, further comprising:
doping source and drain regions of the first plurality of the fins to be of a first conductivity type; and
doping source and drain regions of a second plurality of the fins different from the first plurality of the fins to be of a second conductivity type different from the first conductivity type.

23. The method of claim 22, wherein the source and drain regions of the first plurality of the fins are doped to be p type and the second semiconductor material comprises SiGe.

24. The method of claim 22, wherein the source and drain regions of the first plurality of the fins are doped to be n type and the second semiconductor material comprises SiC.

25. The method of claim 18, wherein
forming the fins includes forming the fins by epitaxial growth, and
a concentration of the chemical species in the first plurality of the fins after the converting is between 30% and 60%.

26. A method comprising:
forming, on a semiconductor substrate made of a first semiconductor material, a layer of a second semiconductor material;
forming trenches in the second semiconductor material, the trenches exposing surfaces of the first semiconductor material;
forming, in the trenches, fins made of the first semiconductor material, the fins having left and right sidewalls in physical contact with the second semiconductor material; and
diffusing a chemical species from the second semiconductor material into a first plurality of the fins via the left and right sidewalls of the fins, the chemical species in the second semiconductor material being between 30% and 60%.

27. The method of claim 26, wherein the second semiconductor material is SiGe or SiC and the first semiconductor material is Si.

28. The method of claim 26, wherein the chemical species is Ge or C.

29. The method of claim 26, further comprising:
doping source and drain regions of the first plurality of the fins to be of a first conductivity type; and
doping source and drain regions of a second plurality of the fins different from the first plurality of the fins to be of a second conductivity type different from the first conductivity type.

30. The method of claim 1 wherein forming the fins includes forming the fins by an epitaxial growth process.

31. The method of claim 1 wherein, following the converting, a concentration of the chemical species in the fins is in the range of about 30-60%.

* * * * *